US012127468B2

United States Patent
Chen

(10) Patent No.: US 12,127,468 B2
(45) Date of Patent: Oct. 22, 2024

(54) PRODUCTION METHOD TO PRODUCE A PRECISION MICRO-MASK INCLUDING ATTACHING A MASK FRAME TO A METAL LAYER BY LASER WELDING AND AN AMOLED DISPLAY MANUFACTURED THEREFROM

(71) Applicant: Magic Star Technology (Ningbo) Co., Ltd., Ningbo (CN)

(72) Inventor: Dinguo Chen, Taipei (TW)

(73) Assignee: Magic Star Technology (Ningbo) Co., Ltd., Ningbo (CN)

(*) Notice: Subject to any disclaimer, the term of this patent is extended or adjusted under 35 U.S.C. 154(b) by 614 days.

(21) Appl. No.: 17/310,789

(22) PCT Filed: Dec. 5, 2019

(86) PCT No.: PCT/CN2019/123381
§ 371 (c)(1),
(2) Date: Aug. 24, 2021

(87) PCT Pub. No.: WO2020/181849
PCT Pub. Date: Sep. 17, 2020

(65) Prior Publication Data
US 2022/0131076 A1    Apr. 28, 2022

Related U.S. Application Data

(60) Provisional application No. 62/816,872, filed on Mar. 11, 2019, provisional application No. 62/816,876, (Continued)

(51) Int. Cl.
H10K 71/20        (2023.01)
H10K 71/00        (2023.01)

(52) U.S. Cl.
CPC ........... *H10K 71/233* (2023.02); *H10K 71/00* (2023.02)

(58) Field of Classification Search
CPC .... H10K 71/80; H10K 71/166; H10K 71/233; H10K 71/621; C23C 14/04
See application file for complete search history.

(56) References Cited

U.S. PATENT DOCUMENTS 5,441,836 A *   8/1995  Balz ..................... B23K 26/352
                                                        430/945
11,088,327 B2 * 8/2021  Chang .................... C09K 11/06
(Continued)

*Primary Examiner* — Khiem D Nguyen
(74) *Attorney, Agent, or Firm* — Wang Law Firm, Inc.

(57) ABSTRACT

A production method to fabricate precision micro-mask for the production of ultra-high resolution Active-Matrix Organic Light Emitting Diode (AMOLED) display is disclosed. The production process of the micro-mask includes the following processes: S1, select the substrate and cleaning. S2, fabricate the main body of micro-mask on the substrate. The main body of micro-mask includes sequentially preparation of debonding layer, the first metal layer and the second metal layer; or sequentially preparation of organic polymer layer, the first metal layer and the second metal layer. S3, welding the mask frame to the second metal layer after alignment, fabricate perforation through holes in the main body of the micro-mask based on the requirement of the display subpixel design; or fabricate perforation through holes in the micro-mask based on the requirement of the display subpixel design, then welding the mask frame to the second metal of the main body of the micro-mask. The precision micro-mask is completed after debonding from the substrate. With the precision micro-mask prepared, the high efficiency, ultra-high resolution (>1000 ppi) AMOLED display with Red-Green-Blue, or other color combinations, side-by-side architecture can be produced.

10 Claims, 9 Drawing Sheets

Related U.S. Application Data filed on Mar. 11, 2019, provisional application No. 62/816,878, filed on Mar. 11, 2019.

(56) References Cited

U.S. PATENT DOCUMENTS

| | | | |
|---|---|---|---|
| 2008/0050895 A1* | 2/2008 | Miyairi | H01L 21/32139 438/671 |
| 2009/0215279 A1* | 8/2009 | Kim | H10K 30/88 257/E21.24 |
| 2015/0059643 A1* | 3/2015 | Du | G03F 7/0015 118/504 |
| 2015/0192819 A1* | 7/2015 | Koo | B29C 70/88 349/158 |
| 2019/0103274 A1* | 4/2019 | Chang | H01L 21/67132 |
| 2019/0296264 A1* | 9/2019 | Mathai | H10K 50/852 |
| 2019/0341265 A1* | 11/2019 | Liu | H01L 21/308 |

* cited by examiner

PRODUCTION METHOD TO PRODUCE A PRECISION MICRO-MASK INCLUDING ATTACHING A MASK FRAME TO A METAL LAYER BY LASER WELDING AND AN AMOLED DISPLAY MANUFACTURED THEREFROM

TECHNICAL FIELD

A manufacture method of ultrahigh resolution organic optoelectronic device, especially the production of high precision micro-mask and the high-resolution AMOLED display produced therefrom.

BACKGROUND ART

AMOLED (Active Matrix Organic Light Emitting Diode Display) is a solid state display device that is composed of organic light emitting diodes based on the stacking of organic semiconductor and other thin films, according to its subpixel and pixel designs. Comparing to the traditional Liquid Crystal Display (LCD), AMOLED possess the advantageous features of light weight, thin form factor, wide viewing angle, good image quality, fast response time, and wider low temperature operating temperature etc., and thus considered the display of the future. By integrating OLED with different Thin Film Transistor (TFT) array driving backplanes, various high end AMOLED display products may be produced in the market, for the applications such as smart phone, television and smart glasses.

Due to the high reactivity of the organic semiconductor material with the ambient moisture and oxygen, conventionally, the industrial production of the high-quality OLED device is achieved by using thermal evaporation in high vacuum evaporator. The patterning of the OLED device during the evaporation process is achieved by heating up the organic semiconductor material in the crucible of the evaporation source to sublime and form a plume of vapor through the outlet of the source and direct through the micro-orifices in the shadow mask and deposit as thin film at the opening regions of the mask on the substrate, which is mounted behind the shadow mask. The shadow mask maybe either a precision Fine Metal Mask (FMM) or a Clear Metal Mask (CMM). The small opening arrays in the FMM defines the location and geometries of the device pattern on the substrate for the specific layer; for an AMOLED, the substrate would be the driving array backplane of the selection. Depending on the design of the OLED device, each device is composed of stacking of multiple layers with electrode at both ends, therefore, multiple metal masks need to be used to fabricate an OLED device. For a full color AMOLED display, it requires multiple color subpixels, for example the red, green and blue subpixels, to form a pixel, so the desired color may be displayed. The precision metal masks are key and costly tooling components needed to produce AMOLED display.

The CMMs are used to fabricate the common layers used in the OLED device, while the FMMs are used to deposit other light emitting layer in the device. A FMM is composed of thin metal foil with perforated through hole arrays, fabricated based on the design of the subpixel of the display required, and mounted on a metal frame. Currently, there are three major processes to fabricate FMM:
1. The chemical etching type fine metal mask;
2. The electro-forming fine metal mask;
3. The hybrid type precision shadow mask.

Among them, the chemical etching type FMM is the only technology in production scale to produce FMM for AMOLED display industry. The chemical etch type FMM uses the thin metal foil produced by rolling, typically the Fe—Ni alloy, with the thickness between 20~100 µm. With photolithography, the desired subpixel patterns are defined by the developed photoresist, followed by chemical etching to produce the micro through holes with several tens of micron sizes. Limited by the thickness of metal foil and the etching accuracy, currently, the AMOLED display with resolution of 400~500 Pixel Per Inch (PPI) can be achieved for commercial products. The large size of FMM is done by attaching multiple strips of thin perforated metal foils after tension, precision alignment and laser welding each strip to the mask frame. The FMM assembly is aligned with the substrate accurately and mounted in the thermal evaporator magnetically, for the subsequent OLED layer evaporation. Currently the largest FMM composed of multiple strips is around 1500 mm×925 mm, for the deposition of OLED on a half size generation 6 (G6H) array backplane glass substrate.

The electro-forming type FMM is fabricated by depositing very thin, typically around 10~20 µm thick, metal film, with the perforated holes of the desired sizes, on the metal substrate, for example stainless steel sheet, in an electroplating bath filled with the related chemicals. The typical metal deposited is nickel-Cobalt (Ni—Co) based alloys. Currently, this method can only produce small size FMM. Large size FMM may be achieved by precisely tiling up small pieces into larger sizes. Currently, the largest size achieved is around 730 mm×920 mm. Because of thinner metal foil can be produced, the FMM for higher display resolution, for example, 700~800 PPI has been prepared for patterning of the AMOLED display. However, due to the limitations such as compositional uniformity and the mechanical strength of the deposited metal foils produced by electro-forming process, this type of FMM is mostly in research and pilot stage of production.

The fabrication of hybrid type precision mask is to deposit polyimide polymer layer, with a thickness of around 6~20 µm, followed with electroplating a supporting metal layer on top. After removal of glass substrate, the assembly can be used to fabricate a precision shadow mask for OLED deposition without tensioning step. Due to the reduction in thickness of the shadow mask layer, the undesirable shadowing effect can be reduced and larger and more uniform light emitting device maybe obtained, thus more power efficient and reliable OLED display maybe achieved. However, this technology is still in research stage and not yet in production.

Current patterning and production technology of AMOLED display is based on the use of shadow mask with thermal evaporation process under vacuum. With the etching type FMM as shadow mask, resolution of 400~500 PPI AMOLED display may be produced; while the electro-forming type and hybrid type may provide the feasible patterning process for producing the resolution up to 500~800 PPI. Due to the insufficient maturity of the electroforming and hybrid type shadow mask, current mainstream AMOLED display product is limited to the resolution around 500 PPI.

Besides the restriction in shadow mask technology, the type of thin film transistor device and its driving backplane could also be limiting to produce AMOLED with high resolution. The use of Si-based CMOS device as driving backplane provide a good alternative to produce ultrahigh resolution AMOLED, for example ~2000~4000 PPI. However, in this case the OLED architecture can only use the white OLED plus Color Filter (WOLED+ CF), instead of the Red-Green-Blue Side-By-Side (RGB SBS) architecture. WOLED is fabricated with the CMM mask as shadow mask, while the R-G-B subpixel is defined by the use of different CF, fabricated by conventional photolithography processes.

New technology breakthrough is required to produce ultrahigh resolution AMOLED with more power efficient RGB Side-By Side architecture. Moreover, the traditional FMM requires sophisticated precision alignment, tensioning, welding and mounting processes which complicate the production process of AMOLED and increase the cost significantly. New high precision shadow mask production technology could enable the fabrication and production of the ultrahigh resolution AMOLED displays with Si-based CMOS backplane, or glass-based or flexible substrate-based AMOLED.

DISCLOSURE

Technical Problem

An embodiment provides fabrication processes to produce the Precision Micro-Mask (PMM);

Another embodiment provides the Precision Micro-Mask (PMM) produced by the disclosed fabrication processes. The PMM produced is used for the shadow mask in Organic Light Emitting Diode (OLED) device patterning process that produces Organic Light Emitting Diode display device with RGB SBS architecture;

Another embodiment provides the full color AMOLED display containing the Organic Light Emitting Diode devices with good performance in image quality, reliability and lifetime.

Technical Solution

According to an embodiment, Organic Light Emitting Diode (OLED) device is produced with a new Precision Micro-Mask (PMM) as shadow mask for the patterning process in thermal evaporation. The fabrication of the PMM includes: S1, clean the selected substrate;

S2, fabricate the main body of the PMM, which includes sequentially process debonding layer, the first metal layer and the second metal layer, or sequentially process organic polymer layer, the first metal layer and the second metal layer;

S3, attach the mask frame to the second metal layer by laser welding, and fabricate the micro-orifice arrays, based on the requirements of the subpixel of the AMOLED display, through the main body of the PMM, or fabricate the micro-orifice arrays through the main body of the PMM and then attach the mask frame to the second metal layer by laser welding; followed by completing the PMM after removal of the substrate.

As an example, the described process S2 that produces the main body of the PMM includes the following steps:
S21, coat the debonding layer or the organic polymer layer on the substrate;
S22, coat the first metal layer on the debonding layer or organic polymer layer;
S23, coat the second metal layer on the first metal layer;
As an example, the described process S3 that produces the PMM includes the following steps:
S31, attach the mask frame to the second metal layer by laser welding;
S32, remove the substrate from debonding layer or organic polymer layer;
S33, by using the laser and the photomask to produce micro-orifice arrays in the main body of the PMM by laser ablation process and complete the PMM fabrication process.

According to the example of the present invention, the described first metal layer and the second metal layer are fabricated in grid structures.

As an example, the described process S3 that produces the PMM includes the following steps:
S31, apply the photoresist layer on the second metal layer;
S32, using photolithography processes to expose and develop the pattern of the micro-orifice array openings in the photoresist layer for the subsequent chemical etching step;
S33, using the chemical etchant to produce the orifice arrays in the main body of the PMM;
S34, attach the mask frame to the second metal layer by laser welding;
S35, remove the substrate from debonding layer or organic polymer layer to obtain the completed PMM.

According to the example of present invention, the thickness of the described organic polymer layer is 0.5 μm~20 μm; the thickness of the described debonding layer is d1, 0.001 μm≤d1≤5 μm;

The thickness of the described first metal layer is d2, 0.01 μm≤d2≤0.5 μm; The material of the first metal layer may be nickel (Ni), or copper (Cu), or titanium (Ti), or silver (Ag), or chromium (Cr), or cobalt (Co), or gold (Au), or their alloys.

The thickness of the described second metal layer is d3, 0.1 μm≤d3≤100 μm. The material of the second metal layer is the high strength, low coefficient of thermal expansion materials, for example: nickel-cobalt (Ni—Co) series alloys, or iron-nickel series (Fe—Ni) alloys, or iron-nickel-carbon (Fe—Ni—C) series alloys.

According to the example of present invention, in between metal grid defines the regions for the production of the micro-orifice arrays, the described micro-orifice arrays are fabricated in the described organic polymer layer in the regions; The width of the metal grid is a, 10 μm≤a≤300 μm;

The dimension of the micro-orifice region between adjacent metal grids for the fabrication of the micro-orifice arrays is b, 1 mm≤b≤320 mm;

The dimension of the micro-orifice is c, 1 μm≤c≤50 μm;

In the same micro-orifice array region, the distance between the neighboring micro-orifices is e, 0.2 μm≤e≤20 μm.

According to the example of present invention, the described main body of the PMM possesses multiple regions of micro-orifice arrays. Each region, corresponding to the OLED display to be produced, contains many of the micro-orifice arrays, based on the requirements of the subpixel design of the OLED display. The dimension of the described micro-orifice region is b, 1 mm≤b≤320 mm;

The spacing between the micro-orifice array regions is a, 10 μm≤a≤300 μm;

The dimension of the micro-orifice is c, 1 μm≤c≤50 μm;

In the same micro-orifice region, the distance between the neighboring micro-orifice is e, 0.2 μm≤e≤20 μm.

According to the example of present invention, the described processing step S21 may include the surface modification treatment; and/or the described processing step S22 may include the surface treatment to the debonding layer.

According to another embodiment of present invention, provides the Precision Micro-Mask (PMM) produced by the disclosed fabrication processes. The PMM produced is used for the shadow mask in Organic Light Emitting Diode (OLED) device patterning process that produces Organic Light Emitting Diode display device with RGB SBS architecture;

According to another embodiment provides the ultra-high resolution (>1000 ppi) full color AMOLED display, produced by using the PMM fabricated, containing the Organic Light Emitting Diode devices with good performance in image quality, reliability and lifetime.

The advantages of present invention are become obvious from the description below, or can be understood through the practices of this invention with the following illustrative examples.

Advantageous Effect

The ultra-high resolution (>1000 ppi) full color Organic Light Emitting Diode (OLED) display of the RGB SBS architecture with good reliability and performance may be realized by using the Precision Micro-Mask (PMM) as shadow mask to pattern OLED devices of the display. The detailed fabrication processes to produce PMM are disclosed.

DESCRIPTION OF THE DRAWINGS

The advantages of this invention are become obvious from the description below, or can be understood through the practices of this invention with the following illustrative examples:

FIG. 2-1. The schematics of the process step S101 described in the Example 1;

FIG. 2-2. The schematics of the process step S102 described in the Example 1;

FIG. 2-3. The schematics of the process step S103 described in the Example 1;

FIG. 2-4. The schematics of the process step S104 described in the Example 1;

FIG. 2-5. The schematics of the process step S105 described in the Example 1;

FIG. 2-6. The schematics of the process step S106 described in the Example 1;

FIG. 2-7. The schematics of the process step S107 described in the Example 1;

FIG. 3. The process diagram of the Example 2 to illustrate fabrication process of a Precision Micro Mask (PMM);

FIG. 3-1. The schematics of the process step S201 described in the Example 2;

FIG. 3-2. The schematics of the process step S202 described in the Example 2;

FIG. 3-3. The schematics of the process step S203 described in the Example 2;

FIG. 3-4. The schematics of the process step S204 described in the Example 2;

FIG. 3-5. The schematics of the process step S205 described in the Example 2;

FIG. 3-6. The schematics of the process step S206 described in the Example 2;

FIG. 3-7. The schematics of the process step S207 described in the Example 2;

FIG. 4. The process diagram of the Example 3 to illustrate fabrication process of a Precision Micro Mask (PMM);

FIG. 4-1. The schematics of the process step S301 described in the Example 3;

FIG. 4-2. The schematics of the process step S302 described in the Example 3;

FIG. 4-3. The schematics of the process step S303 described in the Example 3;

FIG. 4-4. The schematics of the process step S304 described in the Example 3;

FIG. 4-5. The schematics of the process step S305 described in the Example 3;

FIG. 4-6. The schematics of the process step S306 described in the Example 3;

FIG. 4-7. The schematics of the process step S307 described in the Example 3;

FIG. 4-8. The schematics of the process step S308 described in the Example 3;

FIG. 4-9. The schematics of the process step S309 described in the Example 3;

FIG. 5. The schematic of a Precision Micro Mask (PMM) as disclosed in present invention;

FIG. 6 The blowup view of A region in the micro-orifice array area shown in FIG. 1;

DESCRIPTION OF SYMBOLS

10: substrate;
20: Debonding layer or organic polymer layer;
30: The first metal layer;
40: The second metal layer;
50: Mask frame;
60: Photoresist layer;
70: Photomask;
1: The region between the mask frame and main body of the precision micro-mask (PMM) for laser welding;
2: Alignment mark;
3: Micro-orifice array area in the PMM, corresponding to the subpixel designs of the AMOLED display to be patterned.

BEST MODE

Hereinafter embodiments of the present invention are described with detailed examples. These embodiments are exemplary; the present invention in not limited thereto, and the present invention is defined by the scope of claims.

The FIG. 1~FIG. 6 provide the illustrative explanations of the fabrication process of Precision Micro-Mask (PMM) and the structure of a PMM disclosed in present invention.

Figure 1:
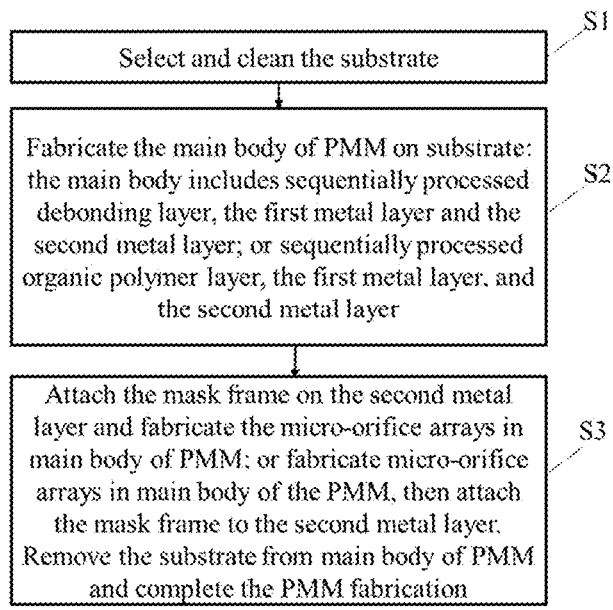
FIG. 1. One process diagram to fabricate the Precision Micro-Mask (PMM) disclosed in present invention.

As shown in FIG. 1, the present invention provides a fabrication method to produce Precision Micro Mask (PMM), which includes:

S1, clean the selected substrate;

S2, fabricate the main body of the PMM, which includes sequentially process debonding layer, the first metal layer and the second metal layer, or sequentially process organic polymer layer, the first metal layer and the second metal layer;

S3, attach the mask frame to the second metal layer by laser welding, and fabricate the micro-orifice arrays, based on the requirements of the subpixel of the AMOLED display, through the main body of the PMM, or fabricate the micro-orifice arrays through the main body of the PMM and then attach the mask frame to the second metal layer by laser welding; followed by completing the PMM after removal of the substrate.

The process described above may produce a Precision Micro-Mask (PMM), which may be used as shadow mask to mount in front of the driving array backplane to pattern the depositing OLED device to produce the ultra-high resolution (>1000 PPI) AMOLED display that traditional FMM cannot achieve.

There is no specific restriction of the type of the organic polymer layer except that it is preferred to select the one with high material stability; low coefficient of thermal expansion (CTE, less than 20 ppm/° C.); and low water absorption (≤1.5 weight %). Which may include the polymer material such as polyimide, polyamide-imide, polyamide, polyethylene, polypropylene, polycarbonate, polyvinyl chloride, polystyrene, and other copolymer resins, or ionomer resins.

The material for debonding layer includes, but not limited to, organic film, such as coating of polyimide, inorganic oxide or nitride film, or other interface modification compounds, such as silane coupling agents, that may modify the interface bonding strength between the substrate and the first metal layer, so the removal of the substrate from the completed Precision Micro-Mask (PMM) maybe reasonably accomplished.

EXAMPLE 1

Figure 2:
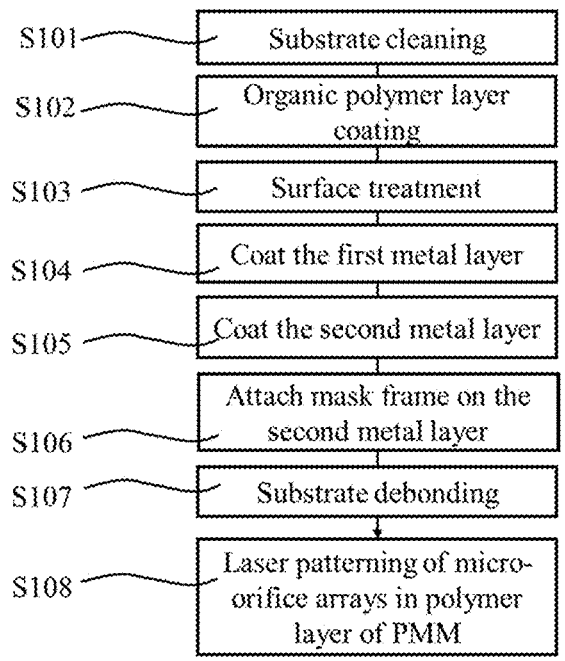
FIG. 2. The process diagram of the Example 1 to illustrate fabrication process of a Precision Micro Mask (PMM)
Figures 1, 2:
Figure 2:
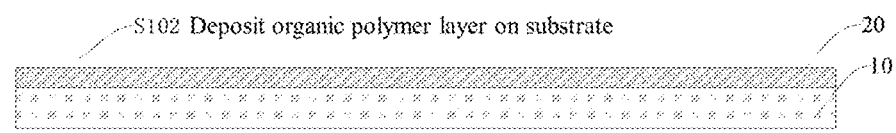

As shown in FIG. 2, the fabrication method to produce a Precision Micro-Mask (PMM) is provided with current example. The FIG. 2-1~FIG. 2-7 below provide detailed description of the processing steps to fabricate a PMM and the PMM produced thereof.

As shown in FIG. 2-1, following step S201, select the substrate 10, which maybe semiconductor wafer, silicon wafer, metal substrate, glass or other transparent substrates. The substrate 10 maybe either non-transparent or transparent materials. Clean to remove the residual organics or contaminants from the surface of the selected substrate, using cleaning agents, ultraviolet (UV) light, and/or plasma.

As shown in FIG. 2-2, according to the step S102 to coat the organic polymer layer (20), for example polyimide, on the substrate (10), followed with drying and curing. The thickness of the organic polymer layer 20 is 0.5~20 μm. In order to ensure the removal of the PMM from the substrate at the end of fabrication, it maybe necessary to conduct surface modification treatment or coating the organic or inorganic interface bonding control layer to control the cohesive force between the organic polymer layer 20 and the substrate 10 before coating the organic polymer layer, for example polyimide layer in this case.

Figures 2, 3:
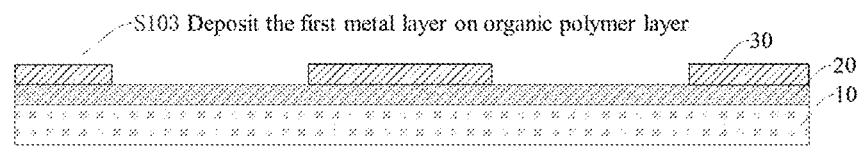

As indicated in FIG. 2-3, following the step S103 to coat the first metal layer 30 on organic polymer layer 20. Firstly, conduct the localized surface modification treatment on the organic polymer layer 20. For example, using a photomask to conduct laser treatment to the selected regions on the organic polymer layer, or conduct regional block coating or printing or screen printing to treat the selected surface regions on the polymer layer.

Secondly, deposit the first metal layer 30 on the organic polymer layer 20; using electroplating or vacuum deposition to deposit a thin layer of the first metal on the selected regions on organic polymer layer 20. The material of the first metal layer 30 may be nickel (Ni), or copper (Cu), or titanium (Ti), or chromium (Cr), or cobalt (Co), or gold (Au), or their alloys. The thickness of the described first metal layer 30 is d2, 0.01 μm≤d2≤0.5 μm. The first metal layer forms a metal grid on the substrate. Between metal grid defines the micro-orifice array regions, which correspond to the size of the AMOLED display to be patterned, to fabricate micro-orifice arrays within. The width of the metal grid is a, 10 μm≤a≤300 μm. The dimension of the micro-orifice region between adjacent metal grids for the fabrication of the micro-orifice arrays is b, 1 mm≤b≤320 mm. However, b is not limited to this size range, but is dependent upon the size of the AMOLED display to produce.

Figures 2, 3, 4:
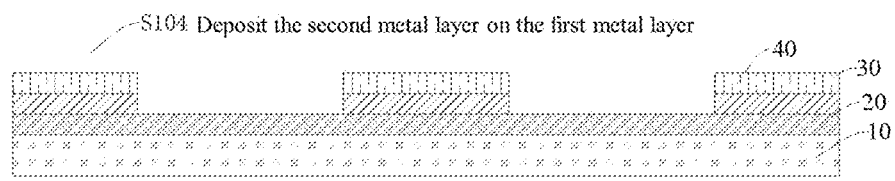

As shown in FIG. 2-4, according to step S104, the second metal layer 40 is deposited on the first metal layer 30, by using electroplating or vacuum deposition processes. The structure of the second metal layer 40 is the same as that of the first metal layer 30, forming a metal grid structure with the same dimensions. The material of the second metal layer is the high strength, low coefficient of thermal expansion materials, for example: nickel-cobalt (Ni—Co) series alloys, or iron-nickel series (Fe—Ni) alloys, or iron-nickel-cobalt (Fe—Ni—Co) series alloys. For example, Invar (36% Ni-64% Fe), or Super Invar (32% Ni-5% Co-63% Fe), or Kovar (54% Fe-29% Ni-17% Co). The thickness of the described second metal layer 40 is d3, 0.1 μm≤d3≤100 μm. If a large size PMM needs to be fabricated, or the size of the AMOLED display, corresponding to the dimensions of micro-orifice array region, is large, an additional photolithography process may be added to coat another metal layer on the second metal layer 40, similar to the second metal layer used, to increase the thickness of the metal grid regions to increase the mechanical strength and stability of PMM structure, before moving to the next processing step.

As shown in FIG. 2-5, according to step S105, the mask frame 50 is attached to the second metal layer 40. To attach the mask frame 50 to the second metal layer 40 at the surrounding edge of main body of the PMM, by using laser welding or other bonding methods.

For example, the mask frame 50 may be in circular shape. With alignment, the inner rim area of the lower surface of the mask frame 50 is attached to the outer rim area of the surface of the second metal layer 40 and bond together by laser welding. The mask frame 50 may be in other shapes, depending on the shape of the PMM fabricated.

As indicated in FIG. 2-6, based on the step S106, the substrate 10 is removed from the organic polymer layer 20 of the PMM. Specifically, separate the substrate 10 from the organic polymer layer 20 of the main body of the completed PMM, by using laser debonding or mechanical debonding process.

As shown in FIG. 2-7, according to the step S107, the micro-orifice arrays are produced in the organic polymer layer 20 in the micro-orifice array regions, using the laser ablation process with photomask. Specifically, the photomask 70, with micro-orifice array patterns, is positioned above the organic polymer layer 20 in the PMM body. The high energy laser beam irradiates through the transparent portions of photomask, and vaporize the irradiated regions in the organic polymer layer and form micro-orifices in the polymer layer. The size of the orifices c is based on the requirements of the opening dimensions of the PMM, which correspond to the design requirements of the subpixels of the AMOLED display needed. The orifice size c is in the range of 1 μm≤c≤50 μm; the distance between neighboring orifices is e, 0.2 μm≤e≤20 μm. The final form of a completed PMM is shown in the FIG. 5 and FIG. 6. To pattern and deposit the OLED device onto the driving backplane substrate to produce the display, the PMM is mounted on top of the backplane after precision alignment, in a thermal evaporation chamber. During evaporation, the vapor of the OLED device material may pass through the micro-orifice arrays in the PMM and deposit at the backplane to form the light emitting subpixels, after multiple layers of the device are deposited sequentially to form the complete OLED device.

EXAMPLE 2-1

As shown in FIG. 3, another fabrication method to produce a Precision Micro-Mask (PMM) is provided with current example. The FIG. 3-1~FIG. 3-7 below provide detailed description of the processing steps to fabricate a PMM and the PMM produced thereof. In current example, the main body of the PMM is composed of the sequentially fabricated debonding layer 20 (in this example the layer 20 represents the debonding layer), the first metal layer 30 and the second metal layer 40.

As shown in FIG. 3-1, following step S201, select the substrate 10, which maybe semiconductor wafer, silicon wafer, metal substrate, glass or other transparent substrates. Although the substrate 10 maybe either non-transparent or transparent materials, current example uses a non-transparent substrate material. Clean to remove the residual organics or contaminants from the surface of the selected substrate 10, using cleaning agents, ultraviolet (UV) light, and/or plasma.

As shown in FIG. 3-2, according to the step S202 to coat the debonding layer 20 (in current example, the 20 represents the debonding layer). The debonding layer 20 includes, but not limited to, organic film, such as polyimide, inorganic oxide or nitride film or other interface modification agents, such as silane coupling agents, that may modify the interface cohesion strength between the substrate 10 and the first metal layer 30 and facilitate the final removal of substrate 10 from the PMM main body, after completing the fabrication process. The thickness of the debonding layer 20 is d1, $0.001\ \mu m \le d1 \le 5\ \mu m$.

As indicated in FIG. 3-3, following the step S203 to coat the first metal layer 30 on the debonding layer 20. The first metal layer 30 is a continuous, un-patterned film, with a thickness of d2, $0.01\ \mu m \le d2 \le 0.5\ \mu m$.

As shown in FIG. 3-4, according to step S204, the second metal layer 40 is deposited on the first metal layer 30, by using electroplating or vacuum deposition processes. The second metal layer 40 is also a continuous, un-patterned film, with a thickness of d3, $0.1\ \mu m \le d3 \le 100\ \mu m$. If a large size PMM needs to be fabricated, or the size of the AMO-LED display, corresponding to the dimensions of micro-orifice array region, is large, an additional photolithography process may be added to coat another metal layer at the non-micro-orifice array regions on the second metal layer 40, using the similar material as the second metal layer used to form a metal grid structure, to increase the thickness of the metal grid regions to increase the mechanical strength and stability of PMM structure, before moving to the next processing step.

Figures 2, 3, 4, 5:
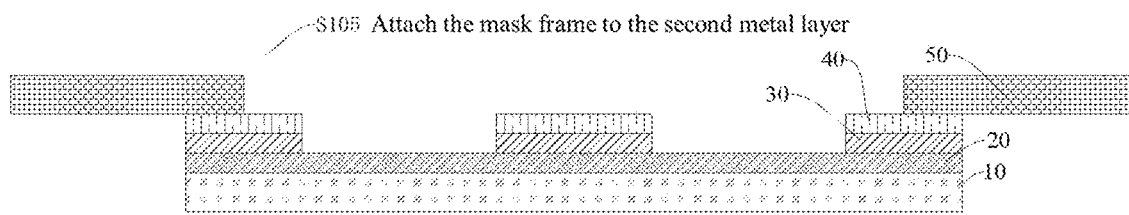

As shown in FIG. 3-5, according to step S205, the mask frame 50 is attached to the second metal layer 40.

As indicated in FIG. 3-6, based on the step S206, the substrate 10 is removed from the debonding layer 20 of the PMM.

Figures 2, 3, 4, 5, 6:
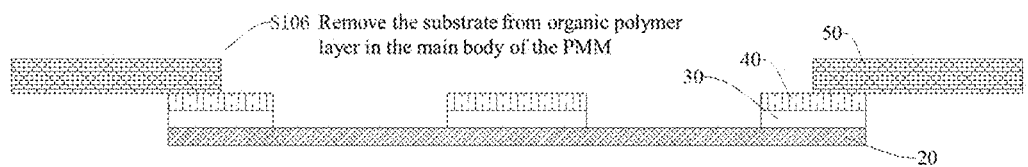
Figures 2, 3, 4, 5, 6, 7:
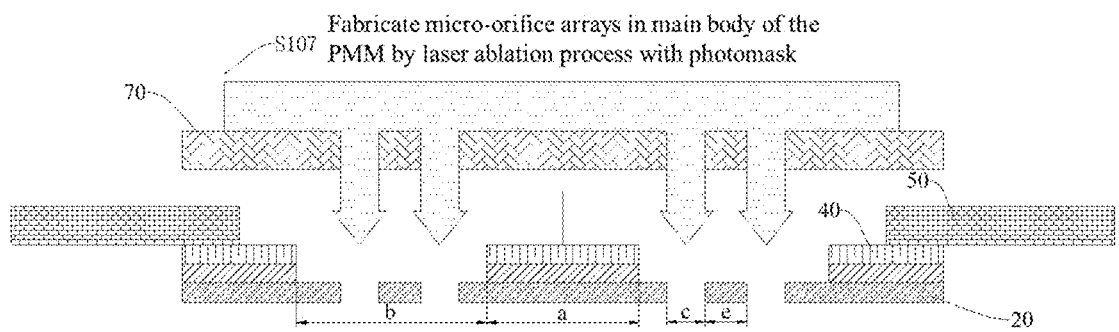
Figure 3:
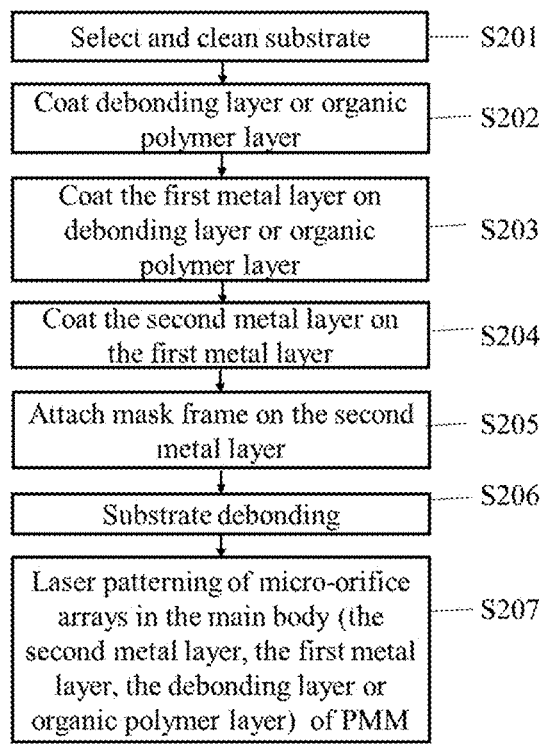
Figures 1, 3:
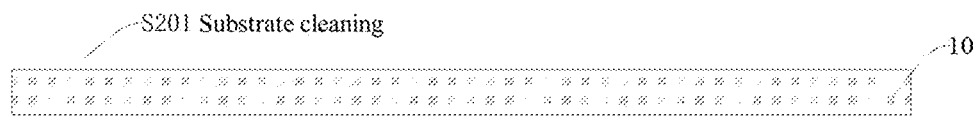
Figures 2, 3:
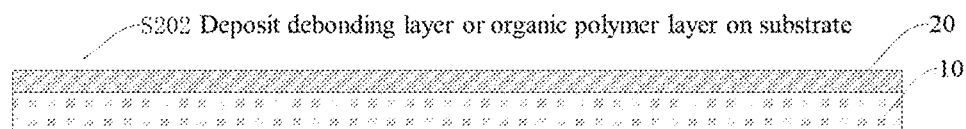
Figure 3:
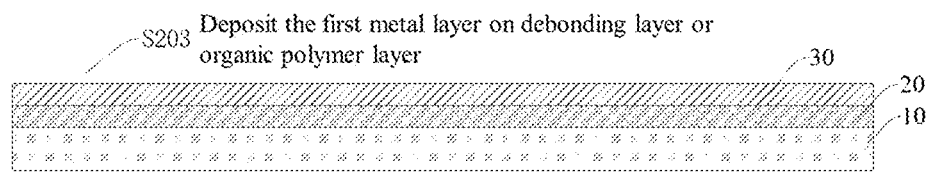
Figures 3, 4:
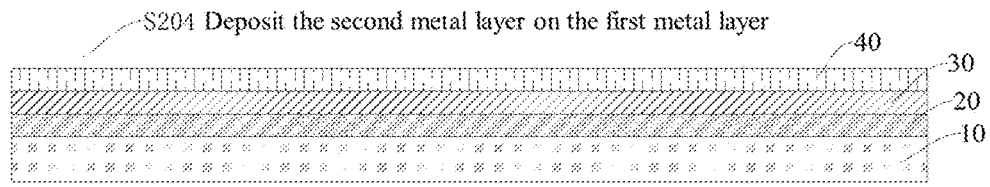
Figures 3, 4, 5:
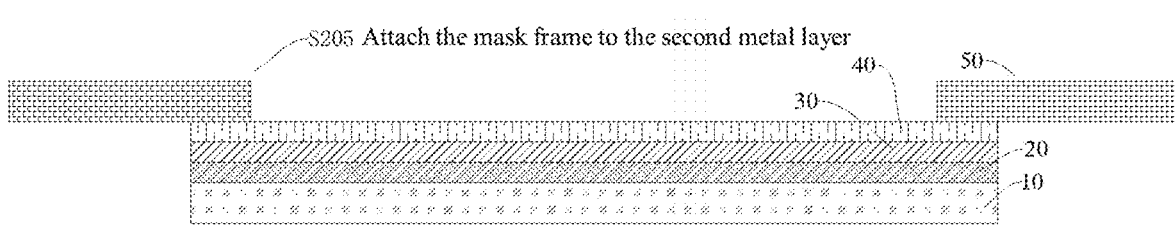
Figures 3, 4, 5, 6:
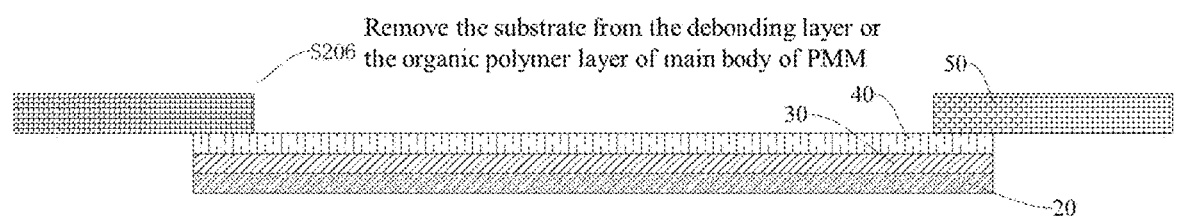
Figures 3, 4, 5, 6, 7:
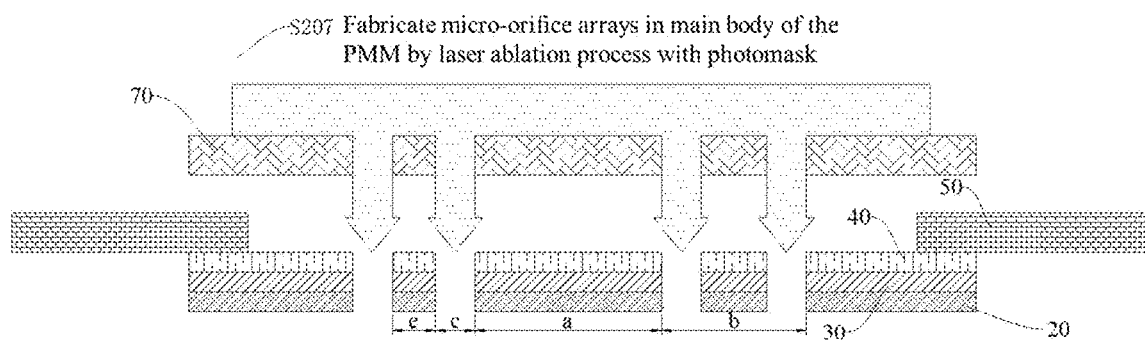
Figure 4:
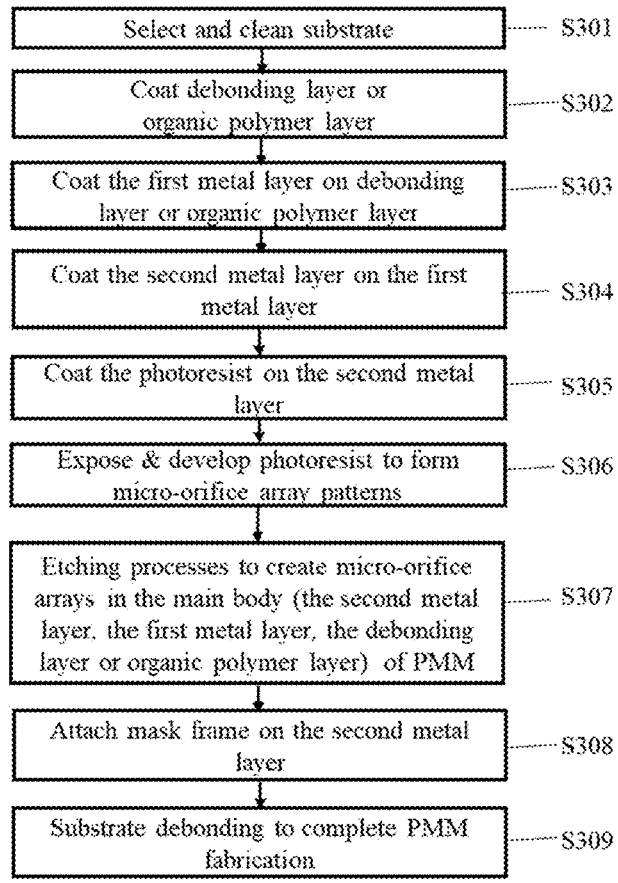
Figures 1, 4:
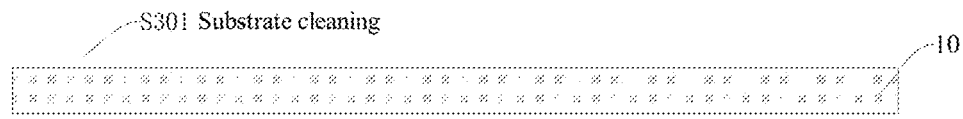
Figures 2, 4:
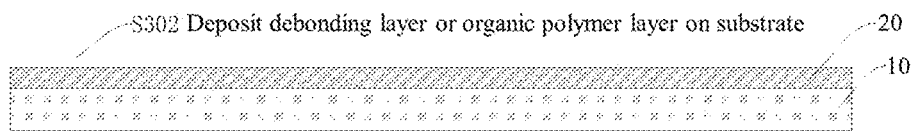
Figures 3, 4:
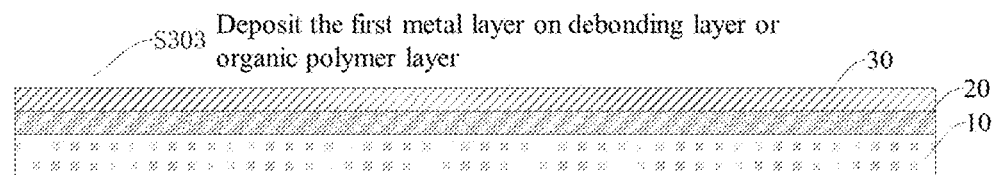
Figure 4:
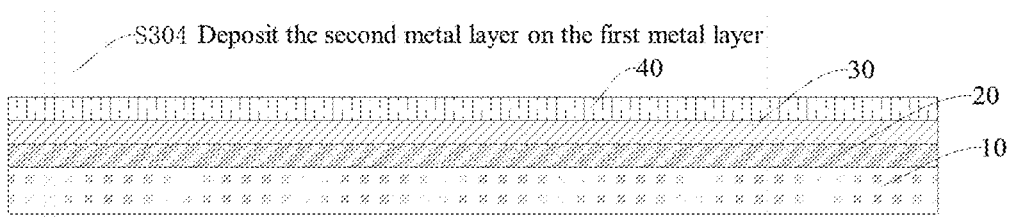
Figures 4, 5:
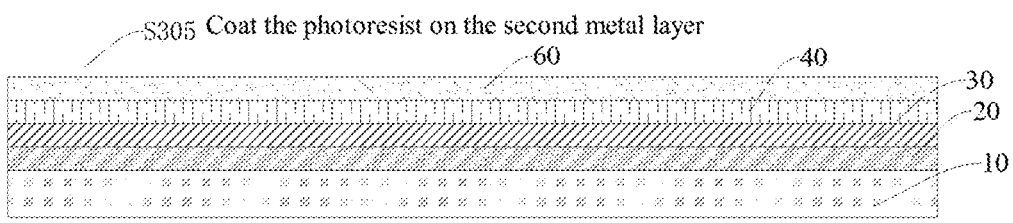
Figures 4, 5, 6:
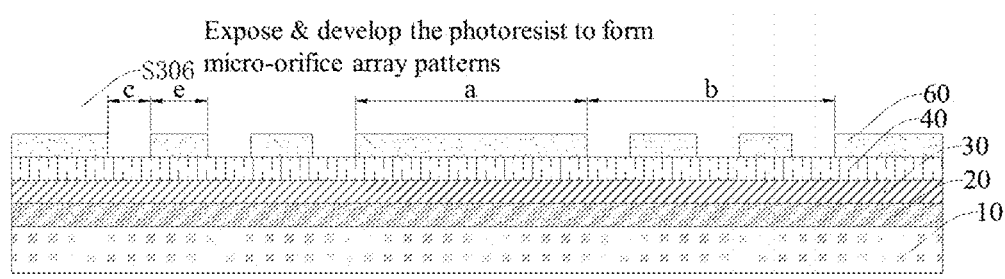
Figures 4, 5, 6, 7:
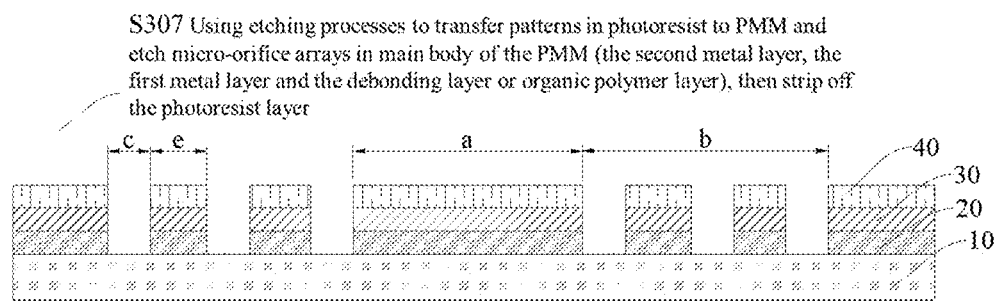
Figures 4, 5, 6, 7, 8:
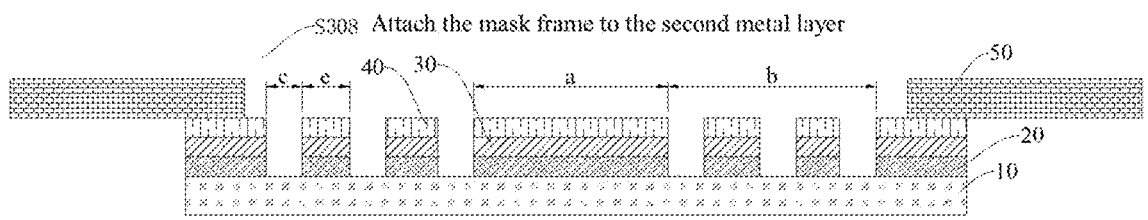
Figures 4, 5, 6, 7, 8, 9:
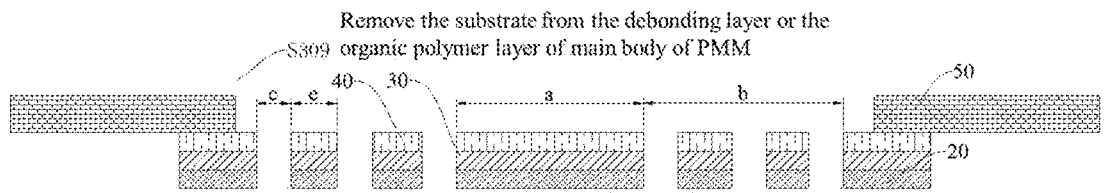
Figure 5:
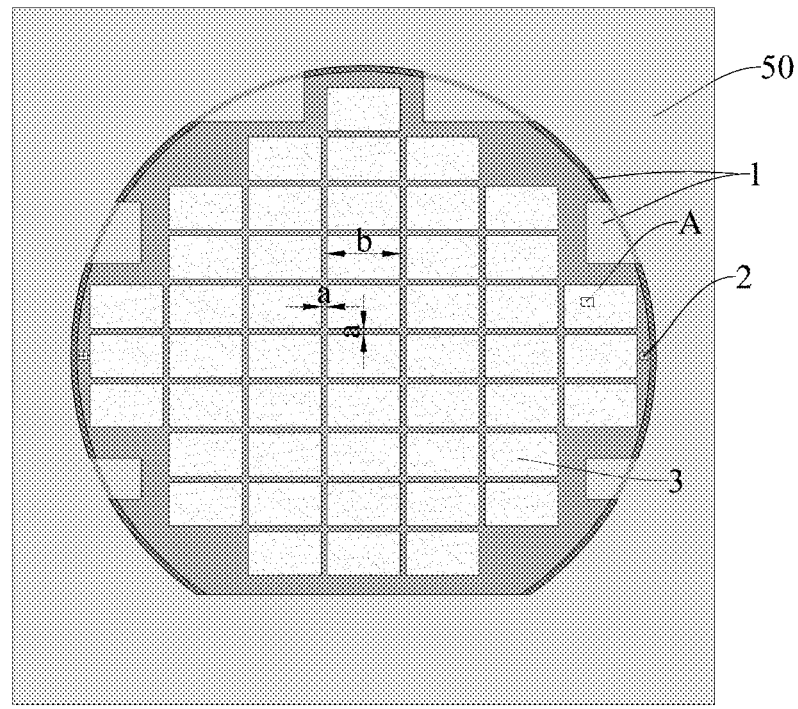
Figure 6:
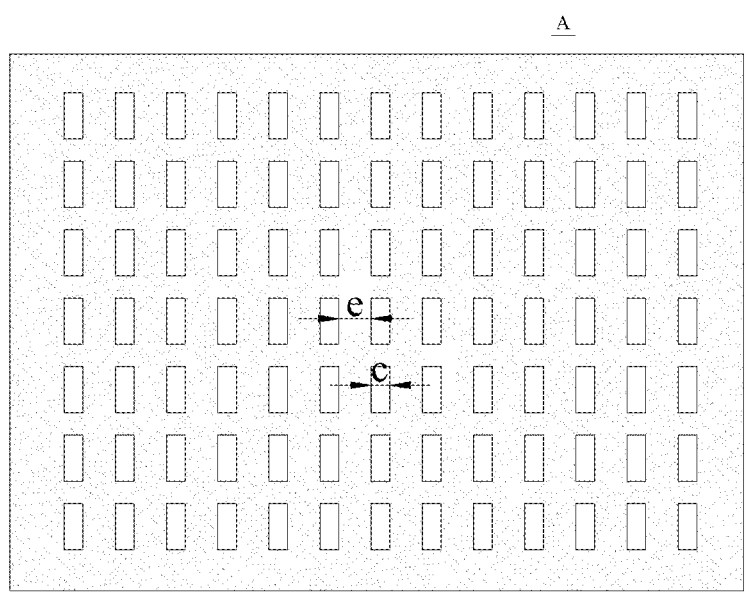

As shown in FIG. 3-7, according to the step S207, the micro-orifice arrays are produced in the second metal Layer 40, the first metal layer 30 and debonding layer 20 in the micro-orifice array regions, using the laser ablation process with photomask. As the Figure shows, the high energy laser beam passing through the photomask 70, with micro-orifice array patterns, may vaporize the second metal Layer 40, the first metal layer 30 and debonding layer 20 stack in irradiated regions and form the corresponding micro-orifice array patterns in the PMM accordingly. The size of the orifices c is based on the requirements of the opening dimensions of the PMM, which correspond to the design requirements of the subpixels of the AMOLED display needed. The orifice size c is in the range of $1\ \mu m \le c \le 50\ \mu m$; the distance between neighboring orifices is e, $0.2\ \mu m \le e \le 20\ \mu m$. With this process, as shown in FIG. 5 and FIG. 6, several micro-orifice array regions are formed in PMM, each region corresponds to the AMOLED display to be patterned, typically in the dimensional range of b, $1\ mm \le b \le 320\ mm$, the b maybe larger than 320 mm to fabricate larger AMOLED displays. The distance between the adjacent micro-orifice array regions is a, $10\ \mu m \le a \le 300\ \mu m$.

EXAMPLE 2-2

The difference between the Example 2-2 and Example 2-1 is in the substrate 10 used and the structure of the main body of PMM. The present example uses the transparent substrate, such as glass or other transparent substrate. The main body of the PMM in this case is sequentially fabricate organic polymer layer 20, such as polyimide layer (in current example, the organic polymer layer is indicated as 20 in the Figure); the first metal layer 30, and the second metal layer 40. The thickness of the organic polymer layer 20 is in the range of 0.5~20 μm.

The fabrication process include:

S201, select a transparent substrate 10 and clean the surface;

S202, coat the organic polymer layer 20, followed by drying and curing processes;

S203, deposit the first metal layer 30 on the organic polymer layer 20;

S204, coat the second metal layer 40 on the first metal layer 30;

S205, using laser welding to attach the mask frame to the second metal layer along the outer rim of the mask;

S206, remove the transparent substrate from the main body of PMM by laser debonding process;

S207, using laser ablation and photomask to irradiate the selected areas in the mask body to remove the second metal layer 40, the first metal layer 30, and the organic polymer layer 20 in the irradiated areas to form micro-orifice arrays in PMM main body. The schematic of the completed PMM is shown in the FIG. 6.

EXAMPLE 3-1

As shown in FIG. 4, current example provides another fabrication method to produce a Precision Micro-Mask (PMM). The FIG. 4-1~FIG. 4-9 below provide detailed description of the processing steps to fabricate a PMM and the PMM produced thereof. In current example, the main body of the PMM is composed of the sequentially fabricated debonding layer 20 (in this example the layer 20 represents the debonding layer), the first metal layer 30 and the second metal layer 40.

As shown in FIG. 4-1, following step S301, select the substrate 10, which maybe semiconductor wafer, silicon wafer, metal substrate, glass or other transparent substrates. Although the substrate 10 maybe either non-transparent or transparent materials, current example uses a non-transparent substrate material. Clean to remove the residual organics or contaminants from the surface of the selected substrate 10, using cleaning agents, ultraviolet (UV) light, and/or plasma.

As shown in FIG. 4-2, according to the step S302 to coat the debonding layer 20 (in current example, the 20 represents the debonding layer) on cleaned substrate 10. The debonding layer 20 includes, but not limited to, organic film, such as polyimide, inorganic oxide or nitride film or other interface modification agents, such as silane coupling agents, that may modify the interface cohesion strength between the substrate 10 and the first metal layer 30 and facilitate the final removal of substrate 10 from the PMM main body, after completing the fabrication process. The thickness of the debonding layer 20 is d1, $0.001\ \mu m \leq d1 \leq 5\ \mu m$.

As indicated in FIG. 4-3, following the step S303 to coat the first metal layer 30 on the debonding layer 20. The first metal layer 30 is a continuous, un-patterned film, with a thickness of d2, $0.01\ \mu m \leq d2 \leq 0.5\ \mu m$.

As shown in FIG. 4-4, according to step S304, the second metal layer 40 is deposited on the first metal layer 30, by using electroplating or vacuum deposition processes. The second metal layer 40 is also a continuous, un-patterned film, with a thickness of d3, $0.1\ \mu m \leq d3 \leq 100\ \mu m$. If the PMM property requires, an additional photolithography process may be added to coat another metal layer at the non-micro-orifice array regions on the second metal layer 40, using the similar material as the second metal layer 40 used to form a metal grid structure, to increase the thickness of the metal grid regions to increase the mechanical strength and stability of PMM structure.

As shown in FIG. 4-5, according to step S305, the photoresist layer 60 is coated on the second metal layer 40. The thickness of the photoresist layer 60 is d4, $0.5\ \mu m \leq d4 \leq 30\ \mu m$.

As indicated in FIG. 4-6, based on the step S306, the pattern of the micro-orifice arrays regions is produced in the photoresist layer 60, by using the photolithography and photomask to expose the photoresist layer 60, followed with development processes.

As shown in FIG. 4-7, based on step S307, using etching processes to etch away the second metal layer 40, the first metal layer 30, and the debonding layer 20 underneath at the patterned regions, defined by the photoresist 60, to produce micro-orifice array regions in the main body of the PMM. Specifically, the wet etching processes may be adopted to etch the second metal layer 40 and the first metal layer 30. For example, FeCl3-based or other metal etchant may be used to etch Invar type metal layers. Other etching process may be adopted to etch the debonding layer 20 underneath. After etching, the photoresist 60 is stripped off by wet chemistry. The size of the micro-orifices c in PMM, corresponding to the requirement of the subpixels of the AMOLED display to be fabricated, is in the range of $1\ \mu m \leq c \leq 50\ \mu m$, while the distance of adjacent orifices with the same region is e, $0.2\ \mu m \leq e \leq 20\ \mu m$. The dimension of the regions of the micro-orifice arrays in PMM is b, corresponding to the dimension of the AMOLED display to fabricate, $1\ mm \leq b \leq 320\ mm$. The distance between adjacent regions of the micro-orifice arrays in the PMM is a, $10\ \mu m \leq a \leq 300\ \mu m$. The structure of the PMM is shown in FIG. 5 and FIG. 6. In case the PMM structure need to be strengthened for stability consideration, additional metal layer may be added for form a metal grid structure at the non-micro-orifice array regions, by using an additional photolithography and metal coating steps, before moving to step S308.

As indicated in FIG. 4-8, according to step S308, the mask frame 50 is attached to the second metal layer 40 near the edge of the substrate 10, along the outer rim of the PMM.

As shown in FIG. 4-9, based on the step S309, the substrate 10 is separated from debonding layer 20; the fabrication of PMM is completed.

EXAMPLE 3-2

The difference between the Example 3-2 and Example 3-1 is in the substrate 10 used and the structure of the main body of PMM. The present example uses the transparent substrate, such as glass or other transparent substrate. The main body of the PMM in this case is sequentially fabricate organic polymer layer 20, such as polyimide layer (in current example, the organic polymer layer is indicated as 20 in the Figure); the first metal layer 30, and the second metal layer 40. The thickness of the organic polymer layer 20 is in the range of $0.5\sim20\ \mu m$, the thickness of the second metal layer is d3, $0.1\ \mu m \leq d3 \leq 100\ \mu m$.

The fabrication process include:

S301, select a transparent substrate 10 and clean the surface;

S302, coat the organic polymer layer 20, followed by drying and curing processes;

S303, deposit the first metal layer 30 on the organic polymer layer 20;

S304, coat the second metal layer 40 on the first metal layer 30;

S305, coat the photoresist layer 60 on the second metal layer 40;

S306, pattern the micro-orifice arrays in photoresist layer 60 by photolithographic exposure with photomask, followed by development processes to produce the pattern for subsequent etching;

S307, etch the micro-orifices in the second metal layer 40, the first metal layer 30, and the organic polymer layer 20 in the PMM main body area to transfer the pattern of the photoresist to the PMM to form micro-orifice array regions in PMM.

S308, attach the mask frame 50 to the PMM at the outer edge regions of PMM near the substrate.

S309, remove the substrate from the organic polymer layer of PMM by debonding process and complete the PMM fabrication process.

As shown in FIG. 6, the schematics of the structure of the Precision Micro-Mask (PMM) produced by the examples described. Region 1 indicates the non-micro-orifice array region that mask frame may use to attach to the main body of the PMM, using laser welding or other bonding methods;

Region 2 indicates the alignment structures, the alignment marks in the PMM are used to accurately align the PMM to the alignment mark on the backplane substrate of AMOLED display underneath before mounted to the thermal evaporator for OLED device deposition. Once the accurate alignment is confirmed, both PMM and backplane substrate is fixed magnetically and mounted on the evaporator for evaporation of OLED devices. The OLED device layers are deposited through the orifices in the PMM to form the subpixels on the driving backplane substrate. The alignment marks in PMM may be adjusted or modified based on the requirement of the alignment marks on the driving backplane and the capability requirements of the alignment system in the thermal evaporator;

Region 3 represents the regions of micro-orifice arrays, which corresponds to the subpixel regions on the driving backplane of the Active-Matrix OLED (AMOLED).

The Precision Micro-Mask (PMM) produced by the examples described in present invention, may be used with different driving backplanes of AMOLED display to deposit the desired OLED devices to form an ultra-high resolution ((>1000 PPI) full color AMOLED display with RGB side-by-side architecture. The driving backplane may include, but is not limited to, Si-based CMOS driving backplane, Low Temperature Poly Silicon Thin-Film-Transistor (LTPS-TFT) backplane, or oxide TFT backplane. Since the OLED device is composed of multiple thin layers, multiple numbers of metal masks may be needed. If different color of OLED device has the same geometric dimensions, it is possible to use the same PMM to pattern different device, by precisely shifting the PMM to the desired position, realigning the PMM to the driving backplane before fixation for deposition. The full color AMOLED display may be achieved by using red, green and blue OLED devices as subpixels, or other color combinations, depending of the AMOLED display characteristics required.

Because very thin main body of the PMM may be produced with present invention, the shadow effect of the PMM to the OLED device maybe dramatically reduced, and thus very uniform, large light emitting device (or called large aperture ratio) may be produced for the final AMOLED. Therefore, OLED devices with uniform, high power efficiency may be produced with PMM as shadow mask for patterning OLED device. Moreover, AMOLED display with superior image quality, reliability and lifetime performance may be achieved.

Besides using the PMM for the patterning OLED devices for the AMOLED display, the present invention may also be applied to pattern other organic materials and device that are susceptible to the reactions with processing chemical, ambient moisture or oxygen. The present invention may also be applied to produce ultra-high resolution PMM for patterning large size AMOLED displays. The PMM may be monolithic or by integrating smaller modular PMMs into larger dimensions to serve the purpose.

The examples disclosed in present invention include the circular substrate; it is also applicable to produce PMM in different geometric shapes and dimensions. To pattern different shapes and different sizes of AMOLED display.

The present invention may fabricate ultra-high resolution Precision Micro-Mask (PMM) that enable the production of ultrahigh resolution AMOLED display with emitting device side-by-side architecture, for example, Red-Green-Blue side-by-side (RGB SBS); Passive Matrix OLED (PMOLED), flexible and glass based OLED display, Si-based micro-OLED, transparent OLED displays that maybe used for applications such as wearables, such as the smart glasses for Virtual Reality (VR), Mixed Reality (MR), Augmented Reality (AR), electronic skin, automotive displays, mobile device, smart phones, e-Books, e-Papers, television, personal computer, portable notebooks, foldable and rollable OLED displays etc.

The examples and descriptions in present invention is exemplary. In the description of present invention, "the feature", "for example" may include one or multiple features or examples, without being listed exhaustively. Although present invention is illustrated with some Examples, so it is understandable to the normal technical people in the field, there are possible variations, modifications, replacement, and change could be made based on the principles and methods disclosed within. The scope of present invention is defined by the claims and their equivalents.

The invention claimed is:

1. A production method to produce a Precision Micro-Mask (PMM) with the following characteristics and processes:
    S1, clean a selected substrate;
    S2, fabricate a main body of the PMM, which includes sequentially processing a debonding layer, a first metal layer and a second metal layer, or sequentially processing an organic polymer layer, the first metal layer and the second metal layer;
    S3, attach a mask frame to the second metal layer by a laser welding process, and fabricate micro-orifice arrays, based on requirements of a subpixel of an AMOLED display, through the main body of the PMM, or fabricate the micro-orifice arrays through the main body of the PMM and then attach the mask frame to the second metal layer by the laser welding process; followed by completing the PMM by removal of the substrate from the main body of the PMM.

2. The PMM production processes as described in claim 1, wherein the process S2 includes the following characteristics:
    S21, coat the debonding layer or the organic polymer layer on the substrate;
    S22, coat the first metal layer on the debonding layer or the organic polymer layer; and
    S23, coat the second metal layer on the first metal layer.

3. The PMM production processes as described in claim 2, wherein the process S3 includes the following characteristics:
    S31, attach and bond the mask frame to the second metal layer by the laser welding process;
    S32, remove the substrate from the debonding layer or the organic polymer layer;
    S33, use the laser and a photomask to produce micro-orifice arrays in the main body of the PMM by a laser ablation process and complete the PMM fabrication process.

4. The production processes described as in claim 3, wherein the first metal layer and the second metal layer are fabricated in grid structures which form a metal grid.

5. The PMM production processes as described in claim 2, wherein the process S3 includes the following characteristics:
    S31, apply a photoresist layer on the second metal layer;
    S32, use photolithography processes to expose and develop a pattern of micro-orifice array openings in the photoresist layer for a subsequent chemical etching step;
    S33, use a chemical etchant to produce the micro-orifice arrays in the main body of the PMM;
    S34, attach and bond the mask frame to the second metal layer by the laser welding process;
    S35, remove the substrate from the debonding layer or the organic polymer layer to obtain the completed PMM.

6. The PMM production processes as described in claim 2, wherein:
    thickness of the aforementioned organic polymer layer is 0.5 µm~20 µm;
    thickness of the aforementioned debonding layer is d1, wherein 0.001 µm≤d1≤5 µm;
    thickness of the described first metal layer is d2, wherein 0.01 µm≤d2≤0.5 µm;
    thickness of the described second metal layer is d3, 0.1 µm≤d3≤100 µm;
    material of the first metal layer may be nickel (Ni), or copper (Cu), or titanium (Ti), or silver (Ag), or chromium (Cr), or cobalt (Co), or gold (Au), or their alloys; and
    material of the second metal layer may be nickel-cobalt (Ni—Co) series alloys, or iron-nickel series (Fe—Ni) alloys, or iron-nickel-cobalt (Fe—Ni—Co) series alloys.

7. The PMM production processes as described in claim 4, wherein production regions for the production of the micro-orifice arrays are defined in between the grid structures of the metal grid, the aforementioned micro-orifice arrays are fabricated in the aforementioned organic polymer layer in the production regions;
    a width of the metal grid is a, wherein 10 µm≤a≤300 µm;

a dimension of the micro-orifice array region is b, wherein 1 mm≤b≤320 mm;

size of micro-orifice is c, in the range of 1 μm≤c≤50 μm; and distances between neighboring micro-orifices, within the same micro-orifice array production region, is e, wherein 0.2 μm≤e≤20 μm.

8. The PMM production processes as described in claim 2, wherein the micro-orifice arrays are fabricated in specific regions in the main body of the PMM, each micro-orifice array region contains many micro-orifices; and a dimension of the described micro-orifice array region is b, wherein 1 mm≤b≤320 mm, corresponding to dimensions of the AMOLED display with which to pattern;

a distance between adjacent micro-orifice array regions is a, wherein 10 μm≤a≤300 μm;

a size of the orifice is c, wherein 1 μm≤c≤50 μm, corresponding to the aforementioned subpixel of the AMOLED display to fabricate; and distance between neighboring micro-orifices, within the same micro-orifice array region, is e, wherein 0.2 μm≤e≤20 μm.

9. The Precision Micro-Mask (PMM) having characteristics that are produced based on the processes described in claim 1.

10. Organic Light Emitting Diode (OLED) devices and OLED displays produced based on the OLED devices which are prepared using the PMM produced in claim 9.

* * * * *